US010054615B2

(12) United States Patent
Schneider et al.

(10) Patent No.: US 10,054,615 B2
(45) Date of Patent: Aug. 21, 2018

(54) CENTERING HOLDING DEVICE FOR A ROGOWSKI COIL AND A METHOD FOR ARRANGING A ROGOWSKI COIL

(71) Applicant: Semikron Elektronik GmbH & Co., KG

(72) Inventors: Alexander Schneider, Fürth (DE); Hartmut Kulas, Heroldsberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 15/267,089

(22) Filed: Sep. 15, 2016

(65) Prior Publication Data

US 2017/0176501 A1   Jun. 22, 2017

(30) Foreign Application Priority Data

Sep. 10, 2015   (DE) .................. 10 2015 115 264

(51) Int. Cl.
*G01R 15/18*   (2006.01)
*G01R 1/04*   (2006.01)

(52) U.S. Cl.
CPC ............. *G01R 15/181* (2013.01); *G01R 1/04* (2013.01)

(58) Field of Classification Search
CPC .................................................. G01R 15/181
See application file for complete search history.

(56) References Cited

U.S. PATENT DOCUMENTS

| | | | |
|---|---|---|---|
| 6,614,218 B1 | 9/2003 | Ray | |
| 9,392,714 B2 | 7/2016 | Bogen | |
| 2006/0232265 A1* | 10/2006 | Fritsch | G01R 15/181 324/142 |
| 2013/0314083 A1* | 11/2013 | Loglisci | G01R 3/00 324/244 |
| 2014/0306690 A1 | 10/2014 | Hewson et al. | |
| 2016/0077133 A1* | 3/2016 | Lee | G01R 15/181 324/127 |

FOREIGN PATENT DOCUMENTS

DE   699 15 816 T2   3/2005
DE   10 2013 103 116   9/2014

* cited by examiner

*Primary Examiner* — Clayton E Laballe
*Assistant Examiner* — Jas Sanghera
(74) *Attorney, Agent, or Firm* — The Law Offices of Roger S. Thompson

(57) ABSTRACT

A centering holding device for a Rogowski coil. The holding device comprises a virtual axis; a first cutout running from a first main side to a second main side thereof through the holding device and is arranged centrally with respect to the axis. The holding device has a channel in the shape of a circle arc around the axis and around the first cutout from a first channel opening to a second channel opening. The first cutout and the channel are coaxial relative to the axis of the holding device. The holding device has a second cutout, which leaves out an edge region of the holding device. The first and second channel openings lead into the second cutout. Furthermore, the invention relates to a method for arranging a Rogowski coil by the holding device.

12 Claims, 3 Drawing Sheets

CENTERING HOLDING DEVICE FOR A ROGOWSKI COIL AND A METHOD FOR ARRANGING A ROGOWSKI COIL

BACKGROUND OF THE INVENTION

1. Field of the Invention

The invention is directed to a centering holding device for a Rogowski coil and a method for arranging a Rogowski coil

2. Description of the Related Art

It is generally known from the prior art to determine an electrical conductor current flowing through an electrical conductor via a Rogowski coil arranged around the electrical conductor. FIG. 2 of United States Published Application No. 2014/0306690 A1 illustrates, by way of example, a Rogowski coil which runs around an electrical conductor to measure the conductor current flowing therethrough. One wire end of the wire from which the Rogowski coil is wound, in the case of the Rogowski coil illustrated therein, is led back again along the Rogowski coil to the other wire end of the Rogowski coil, such that the Rogowski coil is open and can thus easily be arranged around the electrical conductor. Furthermore, it should be noted that the Rogowski coil need not necessarily run around the electrical conductor in a circular fashion, but rather may generally have the form of a loop, such that routine Rogowski coils in the art are often embodied in the form of an open loop arranged around the electrical conductor for the current measurement of the conductor current. A Rogowski coil generates as output signal a voltage signal proportional to the time derivative dI/dt of the conductor current I flowing through the electrical conductor. In order to obtain an accurate measurement signal from the Rogowski coil, the electrical conductor should run as far as possible centrally through the Rogowski coil, i.e. as far as possible centrally through the open loop, and the loop should thus have a circular shape to the extent possible. In particular, the electrical conductor should not be arranged near the ends of the Rogowski coil.

Power electronic devices can be present e.g. as power semiconductor modules or capacitor devices having an individual capacitor or a plurality of capacitors electrically interconnected with one another.

Routine power electronic devices in the art, as known e.g. from German Patent No. DE 10 2013 103 116 B3, in which the power electronic device is embodied as a power semiconductor module, have load connection elements for carrying load currents, with the aid of which load connection elements the power electronic devices are connected to electrically conductive current-conduction elements, such as, e.g., busbars or cables.

SUMMARY OF THE INVENTION

It is an object of the invention is to provide an improved centering holding device for a Rogowski coil, and a method for arranging a Rogowski coil, ehich provide improved performance compared to known devices and methods.

It is an object of the invention to provide a centering holding device for a Rogowski coil and a method for arranging a Rogowski coil which enable an accurate measurement of a conductor current flowing through an electrical conductor by a Rogowski coil.

This object is achieved by a centering holding device for a Rogowski coil, wherein the centering holding device has, in the direction of a virtual axis of the centering holding device, a first cutout running from a first main side of the centering holding device to a second main side of the centering holding device through the centering holding device and arranged centrally with respect to virtual axis of the centering holding device. The centering holding device has a channel running generally in the shape of a circle arc around virtual axis of the centering holding device and around the first cutout from a first channel opening to a second channel opening. The first cutout and the channel are arranged generally coaxially relative to virtual axis of the centering holding device. The centering holding device has a second cutout, which leaves out an edge region of the centering holding device. The first and second channel openings lead into the second cutout.

Furthermore, this object is achieved by a method for arranging a Rogowski coil by a centering holding device according to the invention, wherein a first end of the Rogowski coil is introduced into the first channel opening of the channel of the centering holding device and a section of the Rogowski coil is subsequently pushed through the channel of the centering holding device, wherein the first end of the Rogowski coil, which is introduced into the first channel opening of the channel of the centering holding device, emerges from the second channel opening of the channel of the centering holding device.

Advantageous embodiments of the method are evident analogously to advantageous embodiments of the centering holding device, and vice versa.

It proves to be advantageous if an inner edge of the centering holding device, which inner edge delimits the first cutout, is arranged symmetrically with respect to virtual axis of the centering holding device. What is achieved as a result, is that an electrical conductor led through the first cutout of the centering holding device runs approximately centrally through the Rogowski coil.

Furthermore, it proves to be advantageous if the inner edge is embodied in a toothed fashion. The protuberances forming the teeth of the inner edge can yield slightly in a manner governed by their shape, such that a good positively locking engagement between electrical conductor and inner edge of the centering holding device is achieved by the protuberances.

Furthermore, it proves to be advantageous if the first and second channel openings run approximately radially with respect to virtual axis of the centering holding device, since a first end of the Rogowski coil, which is led through the channel of the centering holding device, is then led back again to the Rogowski coil.

It proves to be advantageous if the centering holding device is embodied in a bipartite fashion comprising a first and a second centering holding device component, which are connected to one another. Fast, simple and efficient production of the centering holding device is made possible as a result.

Furthermore, it proves to be advantageous if the first and second centering holding device components are embodied generally identically and respectively have a partial cutout and a partial channel, wherein the first and second centering holding device components are arranged in such a way that the partial cutout of the first centering holding device component and the partial cutout of the second centering holding device component complement one another to form the first cutout and the partial channel of the first centering holding device component and the partial channel of the second centering holding device component complement one another to form the channel. Particularly efficient production of the centering holding device, e.g., as an injection-molded part composed of plastic, is made possible as a result, since only a single injection mold is required for producing the centering holding device. Particularly fast, simple and efficient production of the centering holding device is made possible as a result.

Furthermore, it proves to be advantageous if the first and second centering holding device components are connected to one another by a pressing, snap-action or adhesive connection; the connection between first and second centering holding device components is then producible in a simple manner.

Furthermore, what proves to be advantageous is a measuring device comprising a Rogowski coil, comprising a connection device and comprising a centering holding device according to the invention. A second end of the Rogowski coil is arranged fixedly in the connection device. The connection device has a receptacle for receiving a first end of the Rogowski coil, and a section of the Rogowski coil is arranged in the channel of the centering holding device while the first end of the Rogowski coil is arranged in the receptacle of the connection device. The Rogowski coil is preferably not cohesively connected to the centering holding device. A current flowing through an electrical conductor running through the cutout of the centering holding device can be measured with high accuracy by the measuring device.

Furthermore, it proves to be advantageous if the receptacle of the connection device is arranged at least approximately in alignment with the second channel opening of the channel of the centering holding device, since a first end of the Rogowski coil, which is led through the channel of the centering holding device, is then arranged in the receptacle of the connection device, without an end region of the Rogowski coil that is associated with the first end of the Rogowski coil having to be greatly bent for this purpose.

Furthermore, it proves to be advantageous if a second end of the Rogowski coil is arranged fixedly in a connection device and the Rogowski coil is pushed through the channel of the centering holding device until the first end of the Rogowski coil emerging from the second channel opening of the channel is received by a receptacle of the connection device, wherein the receptacle of the connection device, upon receiving the first end of the Rogowski coil emerging from the second channel opening of the channel, is arranged approximately in alignment with the second channel opening of the channel. As a result, when arranging the Rogowski coil, simple and efficient production of the measuring device is also achieved at the same time.

Furthermore, a power electronic device comprising a load connection element that is electrically conductive, for electrically connecting the power electronic device, comprising a Rogowski coil arranged around the load connection element, and comprising a centering holding device according to the invention, wherein the load connection element runs through the first cutout of the centering holding device and a section of the Rogowski coil is arranged in the channel of the centering holding device, proves to be advantageous since, in the case of such a power electronic device, an electric current flowing through the load connection element is measurable with high accuracy by the Rogowski coil.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
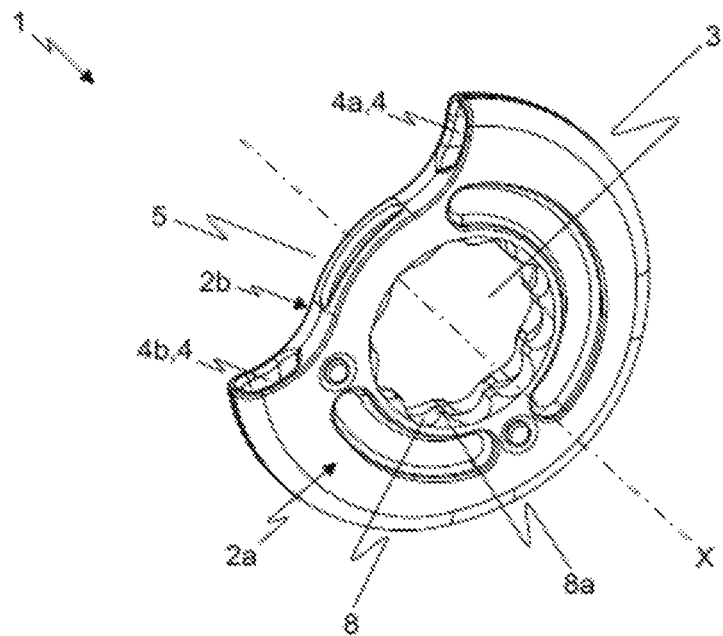
FIG. 1 shows a shows an inventive centering holding device for a Rogowski coil.

FIG. 1 shows an inventive centering holding device 1 for a Rogowski coil. Centering holding device 1 has, in the direction of a virtual axis X of centering holding device 1, a first cutout 3 running from a first main side 2a of centering holding device 1 to a second main side 2b of centering holding device 1 through centering holding device 1 and arranged centrally with respect to virtual axis X of centering holding device 1. First and second main sides 2a and 2b of centering holding device 1 are arranged opposite one another. Centering holding device 1 has a channel 4 running generally in the shape of a circle arc around virtual axis X of centering holding device 1 and around first cutout 3 from a first channel opening 4a to a second channel opening 4b. First cutout 3 and channel 4 are arranged coaxially relative to virtual axis X of centering holding device 1. Channel 4 is thus at a constant distance with respect to virtual axis X of centering holding device 1. Furthermore, centering holding device 1 has a second cutout 5, which leaves out an edge region of centering holding device 1, wherein first and second channel openings 4a and 4b lead into second cutout 5.

Centering holding device 1 has an inner edge 8 delimiting first cutout 3, inner edge 8 preferably being arranged symmetrically with respect to virtual axis X of centering holding device 1. Inner edge 8 has protuberances 8a preferably running in a direction toward virtual axis X of centering holding device 1. Inner edge 8 is thus preferably embodied in a toothed fashion.

First and second channel openings 4a and 4b run generally radially, in particular radially, with respect to virtual axis X of centering holding device 1.

Figure 2:
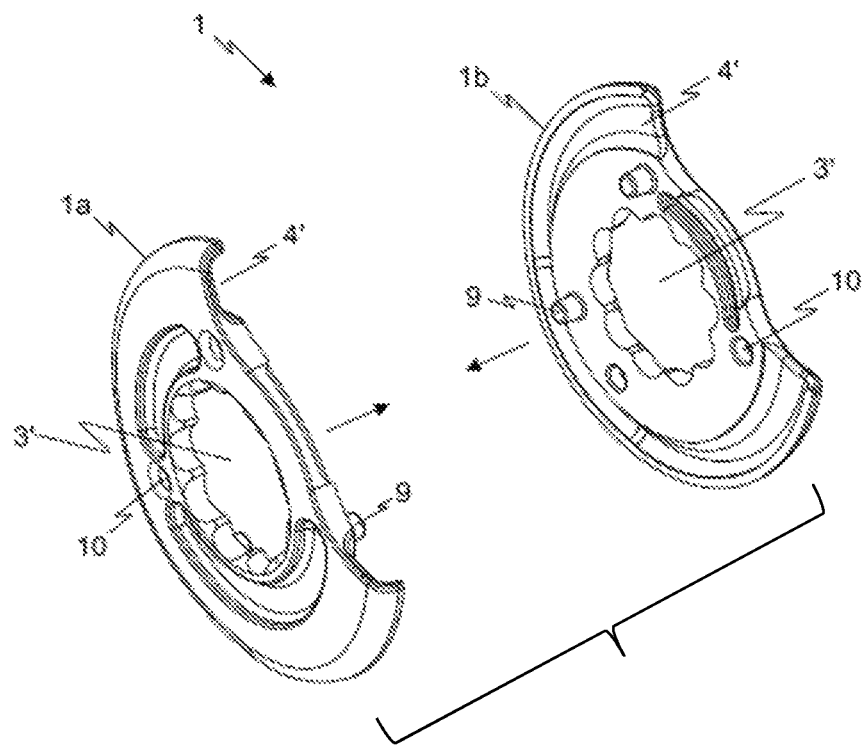
FIG. 2 shows first and second centering holding device components of a centering holding device according to the invention.

As illustrated by way of example in FIG. 2, centering holding device 1 in the context of the exemplary embodiment is embodied in a bipartite fashion comprising a first and a second centering holding device component 1a and 1b, which are preferably connected to one another by a pressing or snap-action connection. Fast, simple and efficient production of centering holding device 1 is made possible as a result. In the exemplary embodiment, first and second centering holding device components 1a and 1b are connected to one another by a pressing connection. For this purpose, first and second centering holding device components 1a and 1b have holes 10 and projections 9 running conically. The pressing connection is realized by projections 9 being pressed into holes 10, which is indicated by two arrows in FIG. 2. It goes without saying, however, that first and second centering holding device components 1a and 1b can, e.g., also be connected to one another by an adhesive connection.

First and second centering holding device components 1a and 1b are preferably embodied identically and respectively have a partial cutout 3' and a partial channel 4'. First and second centering holding device components 1a and 1b are arranged in such a way that partial cutout 3' of first centering holding device component 1a and partial cutout 3' of second centering holding device component 1b complement one another to form first cutout 3 and partial channel 4' of first centering holding device component 1a and partial channel 4' of second centering holding device component 1b complement one another to form channel 4. An identical embodiment of first and second centering holding device components 1a and 1b enables particularly efficient production of centering holding device 1, e.g., as an injection-molded part composed of plastic, since only a single injection mold is required for producing centering holding device 1.

Figure 3:
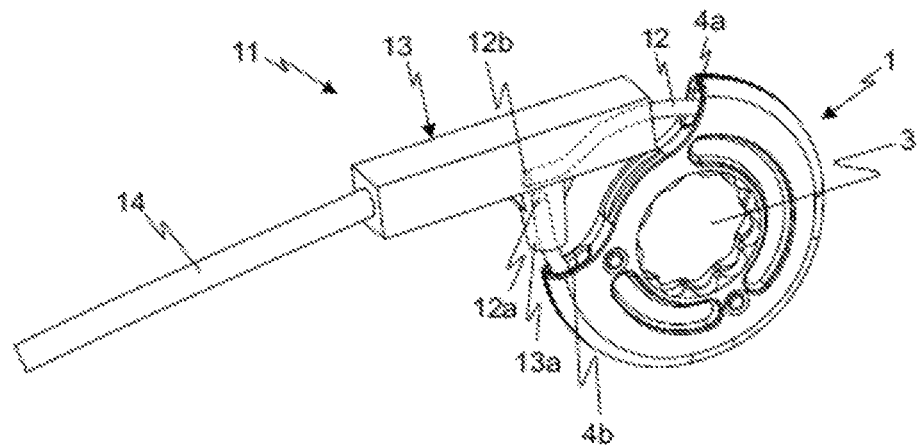
FIG. 3 shows a measuring device comprising a Rogowski coil, a connection device and a centering holding device according to the invention.
Figure 4:
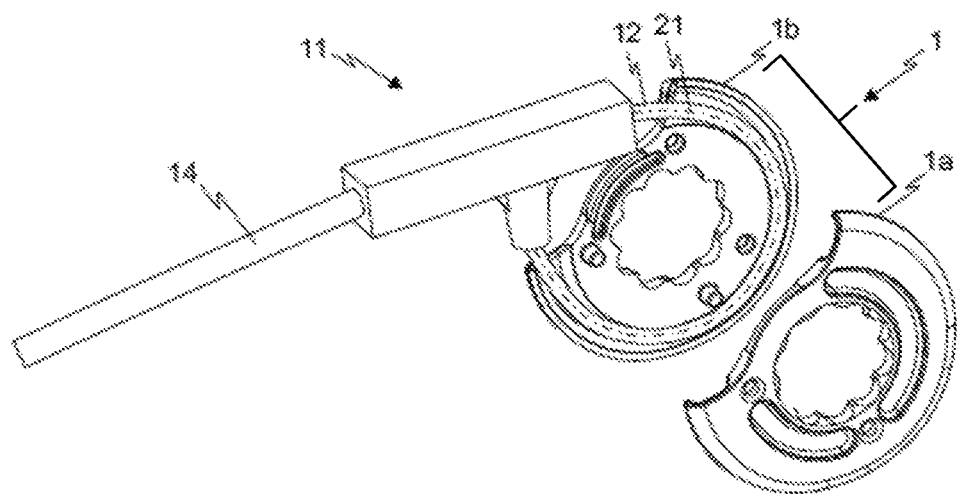
FIG. 4 shows a measuring device comprising a Rogowski coil, a connection device and a centering holding device according to the invention, wherein the first centering holding device component of the centering holding device is illustrated in a manner arranged at a distance from the second centering holding device component of the centering holding device.

FIG. 3 and FIG. 4 illustrate a measuring device 11 having a Rogowski coil 12, a connection device 13 and centering holding device 1, wherein the two ends 12a and 12b of the Rogowski coil 12 arranged in connection device 13 are illustrated in FIG. 3 in a manner indicated as depicted by dashed lines, and in FIG. 3 first centering holding device component 1a of centering holding device 1 is illustrated in a manner arranged at a distance from second centering holding device component 1b of centering holding device 1. FIGS. 3 to 6 illustrate Rogowski coil 12 in each case only schematically in the form of a looped tube 12. The turns of Rogowski coil 12 run around the center line 21 of tube 12, center line 21 being indicated in a dash-dotted manner in FIG. 4. Cutout 3 of centering holding device 1 is provided for the purpose that the electrical conductor whose current is intended to be measured by Rogowski coil 12 is led through it. A section of Rogowski coil 12 is arranged in channel 4 of centering holding device 1. As is readily apparent from FIG. 3 and FIG. 4, as a result of centering holding device 1, to put it more precisely as a result of the circle-arc-shaped course of channel 4 of centering holding device 1, Rogowski coil 12 assumes a generally circular shape and the electrical conductor whose current is intended to be measured is not arranged near the ends 12a and 12b of Rogowski coil 12. Furthermore, centering holding device 1 ensures that there is always a minimum distance between Rogowski coil 12 and the electrical conductor whose current is intended to be measured, and the electrical conductor thus runs to the greatest possible extent centrally through Rogowski coil 12. Preferably, the electrical conductor has a cylindrical, in particular tubular, shape, wherein the external diameter of the electrical conductor preferably is dimensioned so that the electrical conductor is connected to centering holding device 1 in a positively locking manner in a perpendicular direction with respect to virtual axis X of centering holding device 1. What is achieved as a result is that the electrical conductor runs approximately centrally through Rogowski coil 12.

Second end 12b of Rogowski coil 12 is fixedly arranged in connection device 13. Connection device 13 has a receptacle 13a for receiving first end 12a of Rogowski coil 12. A section of Rogowski coil 12 is arranged in channel 4 of centering holding device 1. First end 12a of Rogowski coil 12 is arranged in receptacle 13a of connection device 13. Receptacle 13a of connection device 13 is preferably arranged at least generally in alignment, in particular in alignment, with second channel opening 4b of channel 4 of centering holding device 1. Connection device 13 is preferably connected to a measuring line 14, via which preferably the signal generated by Rogowski coil 12 is conducted electrically to an evaluation device. If appropriate, connection device 13 may also contain signal conversion electronics that generate a measurement signal depending on the signal generated by Rogowski coil 12, which measurement signal is conducted electrically via measuring line 14 to an evaluation device.

For the purpose of arranging Rogowski coil 12 by centering holding device 1, first end 12a of Rogowski coil 12 is introduced into first channel opening 4a of channel 4 of centering holding device 1 and a section of Rogowski coil 12 is subsequently pushed through channel 4 of centering holding device 1, wherein first end 12a of Rogowski coil 12, which is introduced into first channel opening 4a, emerges from second channel opening 4b of channel 4 of centering holding device 1.

Preferably, second end 12b of Rogowski coil 12 is fixedly arranged in a connection device 13 described in the preceding paragraphs and Rogowski coil 12 is pushed through channel 4 of centering holding device 1 until first end 12a of Rogowski coil 12 emerging from second channel opening 4b of channel 4 is received by receptacle 13a of connection device 13, wherein receptacle 13a of connection device 13, upon receiving first end 12a of Rogowski coil 12 emerging from second channel opening 4b of channel 4, is arranged approximately in alignment, in particular in alignment, with second channel opening 4b of channel 4. Receptacle 13a has an opening (not illustrated) through which first end 12a of Rogowski coil 12 emerging from second channel opening 4b of channel 4 is introduced into the interior of receptacle 13a. The dimensions and the geometrical shape of centering holding device 1 and of connection device 13 are embodied in a manner adapted to one another in such a way that first end 12a of Rogowski coil 12 emerging from second channel opening 4b of channel 4, when Rogowski coil 12 is pushed through channel 4, is introduced into receptacle 13a of connection device 13.

Figure 5:
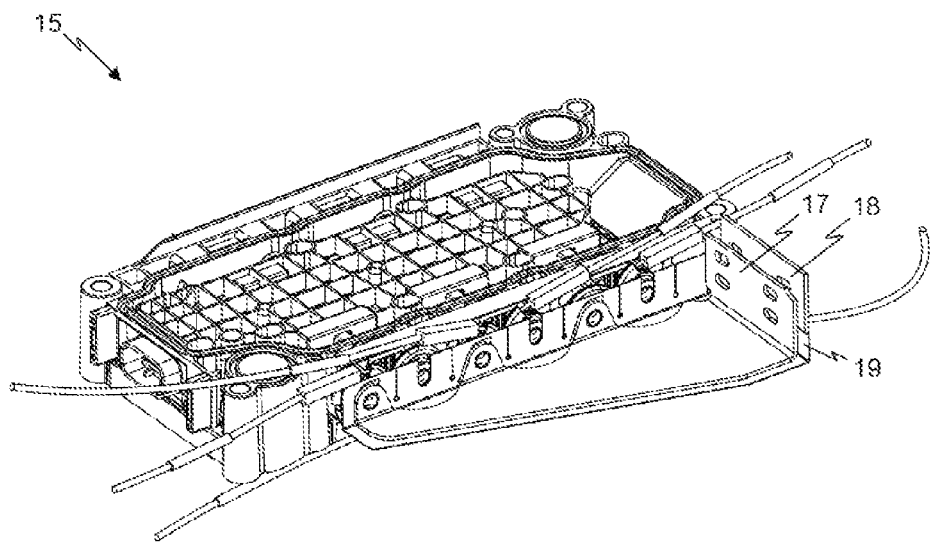
FIG. 5 shows a power electronic device.
Figure 6:
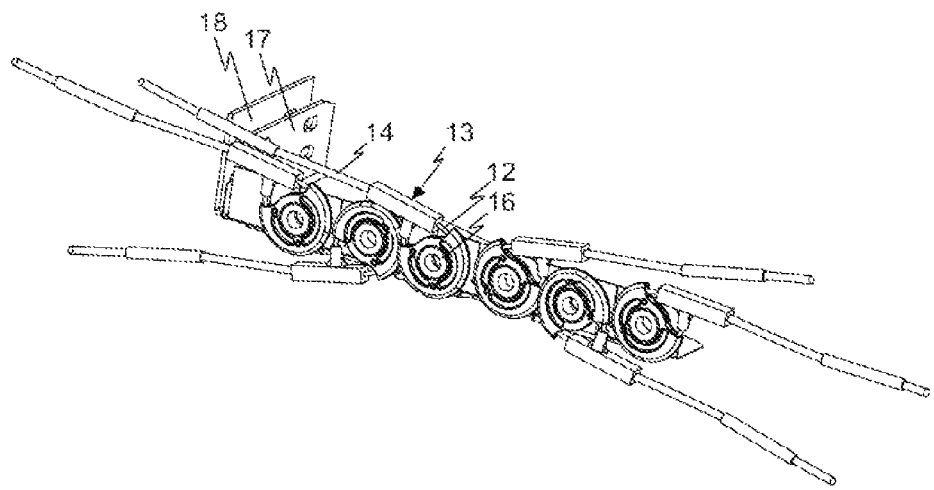
FIG. 6 shows an excerpt from a power electronic device.

FIG. 5 illustrates a power electronic device 15 and FIG. 6 illustrates an excerpt from power electronic device 15, wherein the viewing direction in FIG. 6 runs from the interior of power electronic device 15, said interior not being illustrated in FIG. 6, toward the exterior thereof.

Power electronic device 15 preferably has power semiconductor switches (not illustrated) and, for electrically connecting power electronic device 15, an electrically conductive load connection element 16. Furthermore, power electronic device 15 has a Rogowski coil 12 arranged around load connection element 16, and centering holding device 1 according to the invention, wherein a section of Rogowski coil 12 is arranged in channel 4 of centering holding device 1. Load connection element 16 can be embodied in an integral or multipartite fashion and runs through first cutout 3 of centering holding device 1. Load connection element 16 preferably has, at least in that section of load connection element 16 which runs through cutout 3 of centering holding device 1, a cylindrical, in particular tubular, shape, wherein the external diameter of the relevant section of load connection element 16 preferably is dimensioned so that the relevant section of load connection element 16 is connected to centering holding device 1 in a positively locking manner in a perpendicular direction with respect to virtual axis X of centering holding device 1. What is achieved as a result is that the relevant section of load connection element 16 runs approximately centrally through Rogowski coil 12. Preferably, load connection element 16 is embodied as an electrically conductive solid cylinder, which may have a blind hole provided with an internal thread, or as an electrically conductive sleeve, which may be provided with an internal thread. By the internal thread of load connection element 16, an external electrically conductive current-conduction element, such as e.g. a busbar or a cable, can be connected to load connection element in a simple manner by a screw connection.

In the context of the exemplary embodiment, the ends of Rogowski coil 12, as described in the description concerning FIG. 3 and FIG. 4, are arranged in connection device 13 of power electronic device 15. Connection device 13 and measuring line 14 are respectively embodied as described in the description concerning FIG. 3 and FIG. 4.

In the exemplary embodiment, power electronic device 15 has a plurality of load connection elements 16, wherein the electric currents flowing through load connection elements 16 are measured by a respective Rogowski coil 12, such that the elements described above with regard to one load connection element 16 are present multiply. In the exemplary embodiment, a first portion of load connection elements 16 is electrically conductively connected to a first external busbar 17 and a second portion of load connection elements 16 is electrically conductively connected to a second external busbar 18. First and second busbars 17 and 18 are electrically insulated from one another by an electrical insulation layer 19.

It should be noted at this juncture that, in the case of the invention, Rogowski coil 12 is not cohesively connected to centering holding device 1. Rogowski coil 12 is arranged movably in the channel direction of channel 4. That section of Rogowski coil 12 which is arranged in channel 4 of centering holding device 1 is guided by channel 4 of centering holding device 1 in its spatial course. The cross-sectional area of channel 4 is preferably greater than the cross-sectional area of Rogowski coil 12.

It should furthermore be noted at this juncture that, of course, features of different exemplary embodiments of the invention, provided that the features are not mutually exclusive, can be combined with one another in any desired way.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A centering holding device for a Rogowski coil comprising:
   first and second main sides;
   a virtual axis (X);
   a first cutout running in the direction of said virtual axis from said first main side of the centering holding device to said second main side of the centering holding device through the centering holding device, said first cutout being arranged centrally with respect to said virtual axis (X) of the centering holding device;
   a channel running generally in the shape of a circular arc around said virtual axis (X) of the centering holding device and around said first cutout from a first channel opening to a second channel opening; and
   a second cutout, which leaves out an edge region of the centering holding device;
   wherein said first cutout and said channel are arranged coaxially relative to said virtual axis (X) of the centering holding device; and
   wherein said first and second channel openings lead into said second cutout.

2. The centering holding device of claim 1, further comprising: an inner edge, said inner edge delimiting said first cutout, and being arranged symmetrically with respect to said virtual axis (X) of the centering holding device.

3. The centering holding device of claim 2, wherein said inner edge is embodied in a toothed fashion.

4. The centering holding device of claim 1, wherein said first and second channel openings run generally radially with respect to said virtual axis (X) of the centering holding device.

5. The centering holding device of claim 1, wherein the centering holding device is embodied in a bipartite fashion, and further comprises first and second centering holding device components, which are connected to one another.

6. The centering holding device of claim 5,
   wherein said first and second centering holding device components are substantially identical, and each has a partial cutout and a partial channel; and
   wherein said first and second centering holding device components are arranged so that said partial cutout of said first centering holding device component and said partial cutout of said second centering holding device component complement one another and together form said first cutout and said partial channel of said first centering holding device component and said partial channel of said second centering holding device component complement one another to together form said channel.

7. The centering holding device of claim 5, wherein said first and second centering holding device components are connected to one another by one of a pressing, snap-action and adhesive connection.

8. A measuring device comprising:
   a Rogowski coil having first and second ends;
   a connection device having a receptacle for receiving said first end of said Rogowski coil; and
   a centering holding device, which includes
   first and second main sides;

a virtual axis (X);
a first cutout running in the direction of said virtual axis from said first main side of said centering holding device to said second main side of said centering holding device through said centering holding device, said first cutout being arranged centrally with respect to said virtual axis (X) of said centering holding device;
a channel running generally in the shape of a circular arc around said virtual axis (X) of said centering holding device and around said first cutout from a first channel opening to a second channel opening; and
a second cutout, which leaves out an edge region of said centering holding device;
wherein said first cutout and said channel are arranged coaxially relative to said virtual axis (X) of said centering holding device; and
wherein said first and second channel openings lead into said second cutout;
wherein said second end of said Rogowski coil is fixedly arranged in said connection device;
wherein a section of said Rogowski coil is arranged in said channel of said centering holding device and said first end of said Rogowski coil is arranged in said receptacle of said connection device; and
wherein said Rogowski coil is not cohesively connected to said centering holding device.

9. The measuring device of claim 8, wherein said receptacle of said connection device is arranged at least approximately in alignment with said second channel opening of said channel of said centering holding device.

10. A power electronic device comprising:
an electrically conductive load connection element for electrically connecting the power electronic device;
a Rogowski coil arranged around said load connection element; and
a centering holding device which includes
first and second main sides;
a virtual axis (X);
a first cutout running in the direction of said virtual axis from said first main side of said centering holding device to said second main side of said centering holding device through said centering holding device, said first cutout being arranged centrally with respect to said virtual axis (X) of said centering holding device;
a channel running generally in the shape of a circular arc around said virtual axis (X) of said centering holding device and around said first cutout from a first channel opening to a second channel opening; and
a second cutout, which leaves out an edge region of said centering holding device;
wherein said first cutout and said channel are arranged coaxially relative to said virtual axis (X) of said centering holding device; and
wherein said first and second channel openings lead into said second cutout;
wherein said load connection element runs through said first cutout of said centering holding device and a section of said Rogowski coil is arranged in said channel of said centering holding device.

11. A method for arranging a Rogowski coil having a first end, by a centering holding device which includes
first and second main sides;
a virtual axis (X);
a first cutout running in the direction of said virtual axis from said first main side of said centering holding device to said second main side of said centering holding device through said centering holding device, said first cutout being arranged centrally with respect to said virtual axis (X) of said centering holding device;
a channel running generally in the shape of a circular arc around said virtual axis (X) of said centering holding device and around said first cutout from a first channel opening to a second channel opening; and
a second cutout, which leaves out an edge region of said centering holding device;
wherein said first cutout and said channel are arranged coaxially relative to said virtual axis (X) of said centering holding device; and
wherein said first and second channel openings lead into said second cutout;
wherein the method comprises the steps of:
positioning said first end of said Rogowski coil into said first channel opening of said channel of said centering holding device;
positioning a section of said Rogowski coil through said channel of said centering holding device; and
positioning said first end of said Rogowski coil so that it emerges from said second channel opening of said channel of said centering holding device.

12. The method of claim 11, further comprising the steps of:
affixing a second end of said Rogowski coil to a connection device;
moving said Rogowski coil through said channel of said centering holding device until said first end of said Rogowski coil emerges from said second channel opening of said channel;
inserting said first end of said Rogowski coil into a receptacle in said connection device; and
generally aligning said receptacle of said connection device with said second channel opening of said channel, upon receiving said first end of said Rogowski coil.

* * * * *